United States Patent
Nakamura

[19]
[11] Patent Number: 6,075,708
[45] Date of Patent: Jun. 13, 2000

[54] PARTLY BENT ELECTRIC CIRCUIT SUBSTRATE AND METHOD FOR MANUFACTURING THE SAME

[75] Inventor: Satoshi Nakamura, Kyoto, Japan

[73] Assignee: Rohm Co., Ltd., Kyoto, Japan

[21] Appl. No.: 09/145,294

[22] Filed: Sep. 2, 1998

[30] Foreign Application Priority Data

Sep. 4, 1997 [JP] Japan .................................. 9-239364

[51] Int. Cl.⁷ .................................................. H05K 5/00
[52] U.S. Cl. ........................ 361/752; 361/743; 361/752; 361/784; 361/789; 361/796; 361/803; 361/816; 439/67; 439/76.1; 439/77
[58] Field of Search .................................. 361/784, 796, 361/806, 743, 816, 789, 752; 439/67, 76.1, 77, 541.51, 74.65

[56] References Cited

U.S. PATENT DOCUMENTS 5,442,519 8/1995 DeBalko et al. ....................... 361/784
5,754,411 5/1998 Woychik ................................. 361/803

Primary Examiner—Leo P. Picard
Assistant Examiner—Tuan Dinh
Attorney, Agent, or Firm—Arent, Fox, Kinter, Plotkin & Kahn

[57] ABSTRACT

A partly bent electric circuit is formed including a main circuit substrate in which electric parts such as IC are carried to form an electric circuit, a sub-circuit substrate in which electric parts such as LED which can be recognized from the surface of the set, and a ribbon form metal piece for electrically connecting the main circuit substrate with the sub-circuit substrate, so that, due to the metal piece being bent, the sub-circuit substrate is bent against the above main circuit substrate. As a result, there is obtained an electric circuit substrate wherein the main circuit substrate can be inserted in a narrow place and the sub-circuit substrate part provided with the predetermined parts can be bent to arrange the predetermined parts in an accurate place at a low cost using a low priced print substrate or the like.

9 Claims, 4 Drawing Sheets

PARTLY BENT ELECTRIC CIRCUIT SUBSTRATE AND METHOD FOR MANUFACTURING THE SAME

BACKGROUND OF THE INVENTION

1. Field of the Invention

The present invention relates to a partly bent electric circuit substrate in which the parts are partly bent so as to be exposed to the surface while being disposed in a narrow space as in the circuit substrate to be contained in the cell box of a notebook type personal computer. More particularly, the invention relates to a partly bent electric circuit substrate which can be partly bent without requiring a space while using a low priced print substrate or the like and which can be reliably electrically connected between the substrates on both sides of the bent part, and a method for its manufacture.

2. Description of the Prior Art

The cell box of a notebook type personal computer is constituted so that, as shown for example in FIG. 3(b), a rechargeable secondary cell such as a lithium ion cell is contained in the cell containing part 22 in a resin case 21, so that an electric circuit substrate 23 having a protective circuit for preventing the secondary cell from being overcharged or short-circuited to be exploded and destroyed is contained in the narrow space between the cell containing part 22 of the resin case 21 and the end part of the case 21. Moreover, on the electric circuit substrate 23 there are provided a switch 25, an LED 26 for displaying the cell charge condition, etc., and further a terminal pin for the connector 27 for connection with the power source for charging or for supply of power to the drive circuit for a notebook type personal computer being soldered thrusting through the through-hole of the electric circuit substrate. And, the switch 25 and the LED 26 are required to appear on the surface, and the connector 27 must be inserted in an appropriate position of the connector containing part 29 of the case 21.

As it is necessary for the circuit substrate to be formed so as to be contained in a narrow space and to have the LED part and others appear on the surface with accurate position setting with the notched part of the set, it has been the conventional practice to assemble the circuit parts 28 using an electric circuit substrate 23 comprising a flexible substrate made by providing a flexible film of polyimide or the like with wiring (not illustrated) of copper foil or the like. And, assembly work is manually made by inserting the circuit forming part in the narrow space as mentioned above, bending the part to be exposed outside, so that the connector 27 is contained in the connector containing part 29. It may be conceivable to have the connector 27 secured to the connector containing part 29 of the case 21 in advance and insert the through-hole of the electric circuit substrate 23 in the connector pin. However, in the flexible substrate, the bent part is curved and its shape cannot be established, and therefore the position setting of the through-hole of the electric circuit substrate cannot be accurately made, and soldering is difficult due to the springy nature of the curved condition. For these reasons, it has been practiced to assemble, as described above, with the connector 27 previously soldered to the electric circuit substrate 23.

On the other hand, there is disclosed in Japanese Patent Publication Unexamined No. HEI 8-330727 a method for obtaining a substrate which can be bent at a free angle so made that, in connecting the electric circuit substrates, as shown in FIG. 4, two electric circuit substrates 31 and 32 are disposed on the same split substrate 30, the two substrates are connected by a plated wire 33, after which the split substrate 30 is split by a split groove 34 to make the two electric circuit substrates 31, 32 electrically connected and the substrate bent at a free angle.

The electric circuit substrate which requires to be inserted in a narrow gap and to be partly bent can be formed into small size by being furnished in high density through the use of a flexible substrate as described above, and simply bent, so that the desired parts such as LED can be disposed at approximately a certain place. However, the flexible substrate is very expensive in comparison with the organic epoxy type substrate and costly. Furthermore, as the bent portion does not show plastic deformation and not show constant bending angle, the position setting cannot be accurately carried out, and stress is exerted to the soldered part or the mounted electric parts at the time of the insertion of the connector to show lowering of reliability, or the bent portion is required to be adhered by both side adhesive tape or the like. Moreover, it is weak in mechanical strength as a substrate for the switch, and a reinforcing material is required on the reverse side thereof. In addition, the wiring of the flexible substrate comprises copper foil of very thin thickness of 35 μm, through which no large current can be led. Therefore, there is a problem in complication of manufacturing process leading to higher cost and lower reliability.

The method of connecting the two circuit substrates by the plated wire is accompanied with the necessity to provide the substrates on both sides with through-holes for insertion of the plated wire, and also to insert the plated wire into the through-holes and secure it by soldering. If the aim is only to make electrical connection of the two substrates, such a method is desirable in securing connection, but for the requirements for inserting in a narrow space, bending a part so as to have the predetermined parts only expose in front, and yet to make electric connection with sufficient electric capacity through the bent part, said method involves a problem that it is not possible to insert in the narrow space due to the projections formed on both the surface and the reverse side of the substrate. In other words, because the conventional method is to insert a plated wire in the substrate in a manner to form an arc and solder it on the reverse side of the substrate, on the substrate surface there is required a thickness corresponding to the thickness of the arc portion, and on the reverse side of the substrate there is necessitated to project a plated wire and solder the projection. Furthermore, there is a problem in connecting with the plated wire that, notwithstanding the difficulty of bending and especially sharp angle bending, the cross-sectional area is small and large current is less easily run. Such a point did not occur as problematic matter in the technique disclosed in Japanese Patent Publication Unexamined No. HEI 8-330727 as it was free from the requirements of providing the substrate in a narrow space and exposing only a part of the content on the surface.

SUMMARY OF THE INVENTION

The present invention has been made to solve the above problems, and its object is to provide a partly bent electric circuit substrate which can be inserted in narrow place and the predetermined parts can be arranged in an accurate place partly bent at a low cost using a low priced print substrate or the like.

Another object of the present invention is to provide a cell box made by using the above electric circuit substrate.

A further object of the present invention is to provide a manufacturing method in which a partly bent electric circuit substrate as above can be simply manufactured.

The partly bent electric circuit substrate according to the present invention comprising:

a main circuit substrate in which electric parts are carried to form an electric circuit;

a sub-circuit substrate in which there is provided at least a connecting part with external circuit or a switch or a display element; and a ribbon form metal piece for electrically connecting the main circuit substrate with the sub-circuit substrate;

wherein due to the metal piece being bent, the sub-circuit substrate is bent against the above main circuit substrate.

When the main circuit substrate and the sub-circuit substrate as described above are formed respectively of the print-circuit board, the circuit substrates become very low cost, and have mechanical strength and are durable against ON/OFF of switch and the like.

The above ribbon form metal piece can be electrically connected simultaneously with the electrical parts through electrical connection between the main circuit substrate and the sub-circuit substrate by the soldering of both ends on the pads for electrical connection between the main circuit substrate and the sub-circuit substrate, and the connection can be made without protruding the metal piece.

The above ribbon form metal piece, due to its thickness being 100 to 150 $\mu$m, can be simply folded and can lead the electric current to a sufficient degree.

Because of the provision of one or more sub-circuit substrate and at least the display element on the sub-circuit substrate and the connecting part with the connector, it becomes possible to expose the display unit and the connecting part while inserting the electric circuit substrate in a miniature and narrow space, with the result that the cell box and the like can be obtained at a low cost. Here, the display element and connector connecting part may be provided on the respective parts of two or more sub-circuit substrates, or altogether on a single sub-circuit substrate. By the term display element is meant an element that can be displayed such as LED, liquid crystal display element, miniature lamp, etc.

The cell box of the present invention comprises: a case; a cell containing part provided in the case; and an electric circuit substrate to be inserted in the gap in the vicinity of the cell containing part, and wherein the electric circuit substrate comprises a main circuit substrate in which electric parts are carried to form an electric circuit, a sub-circuit substrate in which there can be provided at least a connecting part with external circuit or a switch or a display element, and a ribbon form metal piece for electrically connecting the main circuit substrate with the sub-circuit substrate, wherein due to the metal piece being bent, the sub-circuit substrate is bent against the above main circuit substrate.

At least one piece of the above sub-circuit substrate may be bent at a right angle to the main circuit substrate in a manner to be exposed to one side of the above case, by which it becomes possible to provide the switch in a place easy to handle or to make the display lamp easy to see.

The above sub-circuit substrate may be provided at least two pieces, and the two pieces of the sub circuit substrate may be bent to the opposite sides respectively at the center of the above main circuit substrate.

A method for manufacturing the circuit substrate according to the present invention comprising the steps of: (a) preparing a parent substrate in which a main circuit substrate and a sub-circuit substrate are connected with a selvage part respectively through the connecting part; (b) forming an electric circuit by providing electric parts on the main circuit substrate and the sub-circuit substrate, respectively, and providing a metal piece in a manner to ride over the pads for electrical connection between the main circuit substrate and the sub-circuit substrate; (c) soldering the electric parts and metal pieces in a reflow furnace; and (d) separating the main circuit substrate and the sub-circuit substrate from the selvage, and bending the above metal piece to bend the sub-circuit substrate against the above main circuit substrate.

DETAILED DESCRIPTION

Figure 1A:
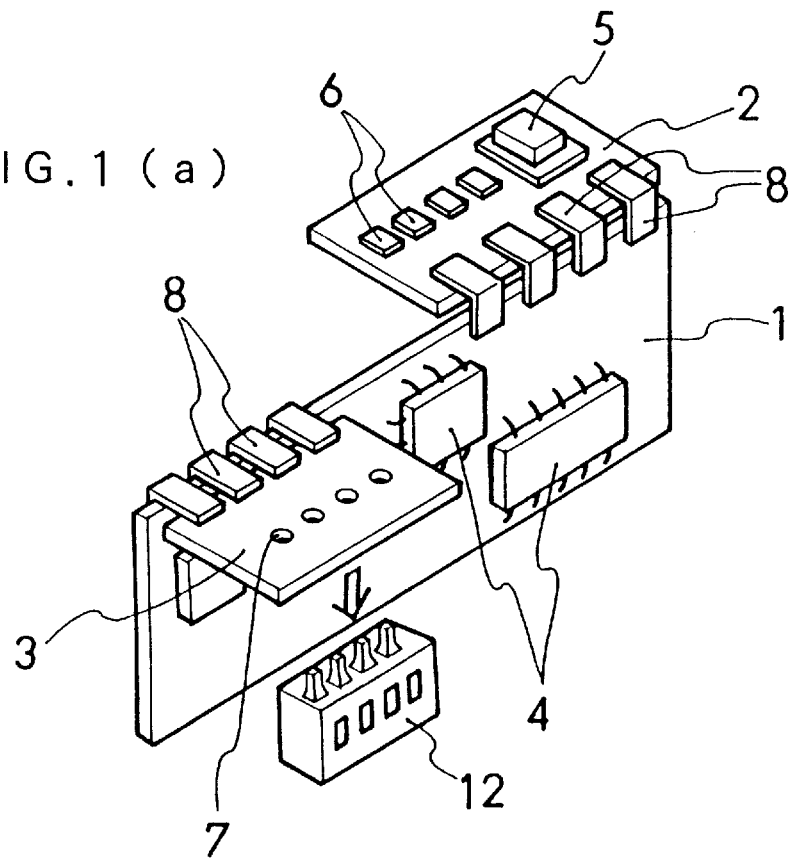
FIGS. 1a and 1b are is a view for illustrating an embodiment of a partly bent electric circuit substrate of the present invention.

The electric circuit substrate of the present invention is designed to permit insertion in a narrow gap such as is used for a cell box of a notebook type personal computer, and a part of said substrate is bent to have a part of the predetermined parts exposed on its upper surface, and a perspective view of one embodiment thereof is shown in FIG. 1(a). The electric circuit substrate comprises a main circuit substrate 1 in which electric parts such as IC4 are carried to form an electric circuit, sub-circuit substrates 2, 3 in which there are provided a switch 5, an LED 6 for display, a connecting unit 7 for a connector, etc. which are to be exposed outside from the case, in which electric circuit substrate such as a cell box is to be assembled, and a ribbon form metal piece 8 for electrically connecting the main circuit substrate 1 with the sub-circuit substrates 2, 3. And, due to the metal piece 8 being bent, the sub-circuit substrates 2, 3 are bent against the above main circuit substrate 1.

For the main circuit substrate 1, there can be used a print-circuit board (print substrate) made by printing a wiring on a substrate of epoxy, glass epoxy, paper epoxy, etc. In order to be connected with the wiring of said print substrate, there are provided the electric parts such as IC4 to form an electric circuit which plays a role of cell protection such as for example prevention of excessive charging of the charge type secondary cell or circuit breaking in the case of the short-circuiting of the cell. The sub-circuit substrates 2, 3 also comprise the similar print substrates, and the like. They carry the electric parts such as switch 5, LED 6 for displaying the charging condition of the charge type cell, and the like, and are connected to the wiring by soldering or the like. In addition, there are provided the connector connecting parts 7 which include terminal holes for accommodating the power terminal and the terminal pins for the connector 12 for connection with the drive circuit for a notebook type personal computer. It is convenient in carrying out high density provision of electric parts and the like that these circuit substrates are not provided with through-hole except for the connector connecting part 7 and that the electric parts are placed on the solder paste and the like carrying the surface provision type electric parts on an electrode pad and soldered in a reflow furnace or the like.

The metal piece 8 is, for example, a nickel plate having a thickness of about 100–150 $\mu$m formed into a ribbon form in a width of about 3–5 mm (variable by current amount) and a length of about 10 mm. Both ends thereof are placed on the pad for connecting the main circuit substrate 1 and the sub-circuit substrates 2, 3 through the solder paste, and they are soldered together with the electric parts mentioned above to make electrical and mechanical connection between the main circuit substrate 1 and the sub-circuit substrate 2, 3. This metal piece 8 has a thickness of about four times as large as the copper foil of flexible cable substrate, and can lead the electric current as much as about four times with the same width, and has high mechanical strength. The thickness of the metal piece 8 given above is an example, and the metal piece can be formed in an optional thickness insofar as it can be bent and has a certain strength.

Figure 1B:
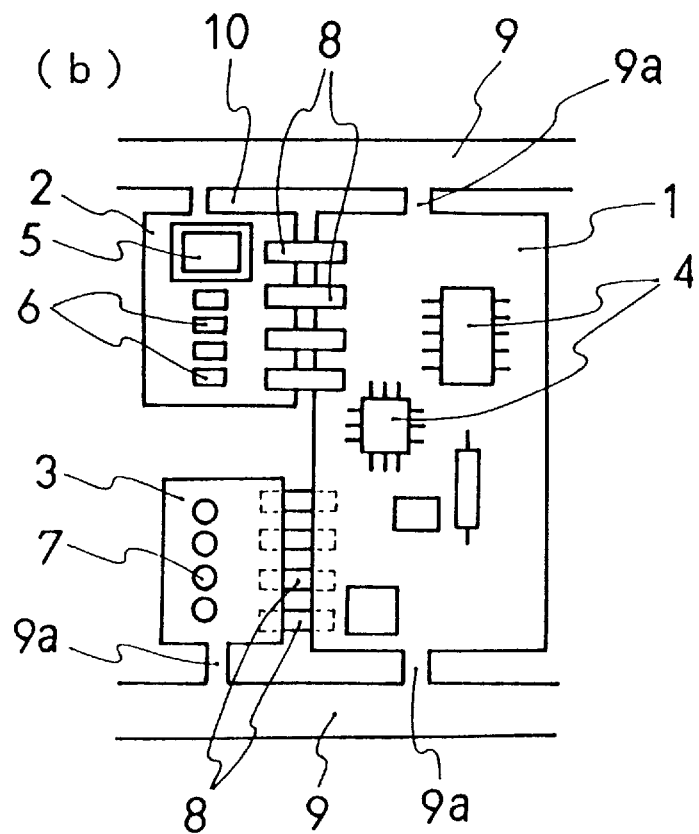

In order to produce this electric circuit substrate, as shown in FIG. 1(*b*), a parent substrate comprising glass epoxy or the like is provided with a split groove 10 to make the main circuit substrate 1 and the sub-circuit substrates 2, 3 connected to the selvage part 9 through the linked part 9*a*, and a wiring pattern (not illustrated) is formed. And, in order to make electrical connection with the wiring patterns of the main circuit substrate 1 and the sub-circuit substrates 2, 3, the electric parts such as IC4, reset switch 5, LED 6 for display, and the like are provided to form an electric circuit and necessary display, and the like. Further, a metal piece 8 is provided on the pad (not illustrated) for the electrical connection between the main circuit substrate 1 and the sub-circuit substrates 2, 3 so as to bridge over the two substrates. Next, in the reflow furnace the electrical parts such as IC4 and the metal piece 8 are fixed by soldering. Because the place to be connected of the metal piece 8 becomes inverse as being surface side and reverse side between the one sub-circuit substrate 2 and the other sub-circuit substrate 3, connection is first made between the one sub-circuit substrate 2 and the main circuit substrate 1 by the metal piece 8, followed by carrying out the connection between the other side sub-circuit substrate 3 and the main circuit substrate 1 again in the similar manner by reversing the parent substrate. In so doing, since the place once soldered is not molten to become separated at the time of the next soldering, soldering can be made with the solder of the same melting temperature. Thereafter, it becomes possible to separate the main circuit substrate 1 and the sub-circuit substrates 2, 3 from the above selvage part 9 and bend the metal piece 8, by which the sub-circuit substrates 2, 3 can be bent against the main circuit substrate 1. Thus, there can be formed an electric circuit substrate as shown in FIG. 1(*a*) with a part of the substrate bent so as to have the predetermined parts such as LED 6 exposed on the exposed part.

Figure 2:
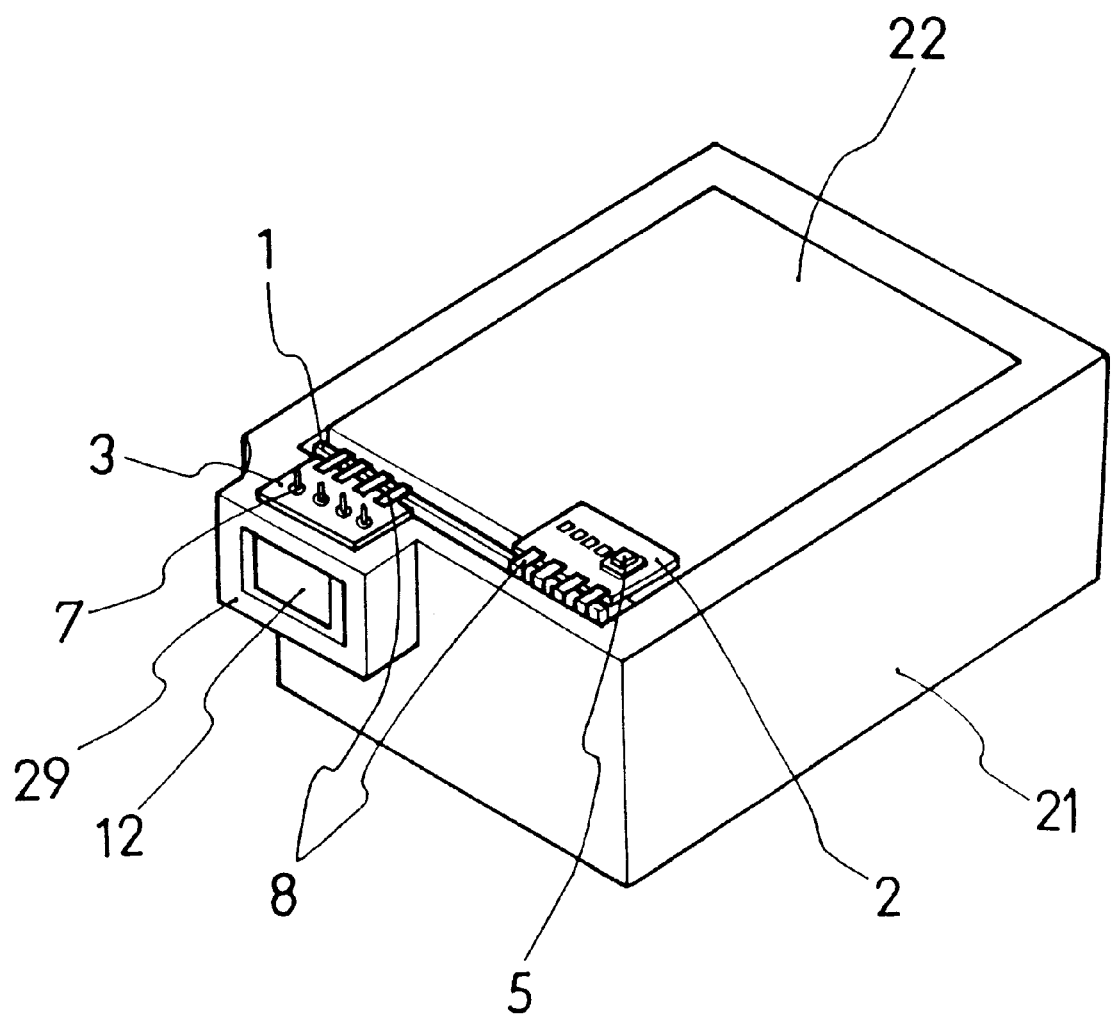
FIG. 2 is a perspective view of an example of the cell box in which an electric circuit substrate of FIG. 1 is assembled.
Figure 3A:
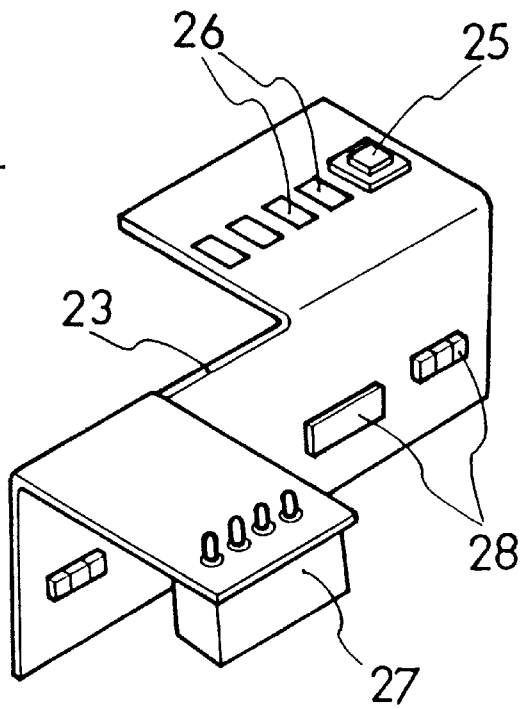
FIGS. 3a and 3b are views showing an example of the conventional cell box for a notebook personal computer and a flexible substrate to be used therefor.
Figure 3B:
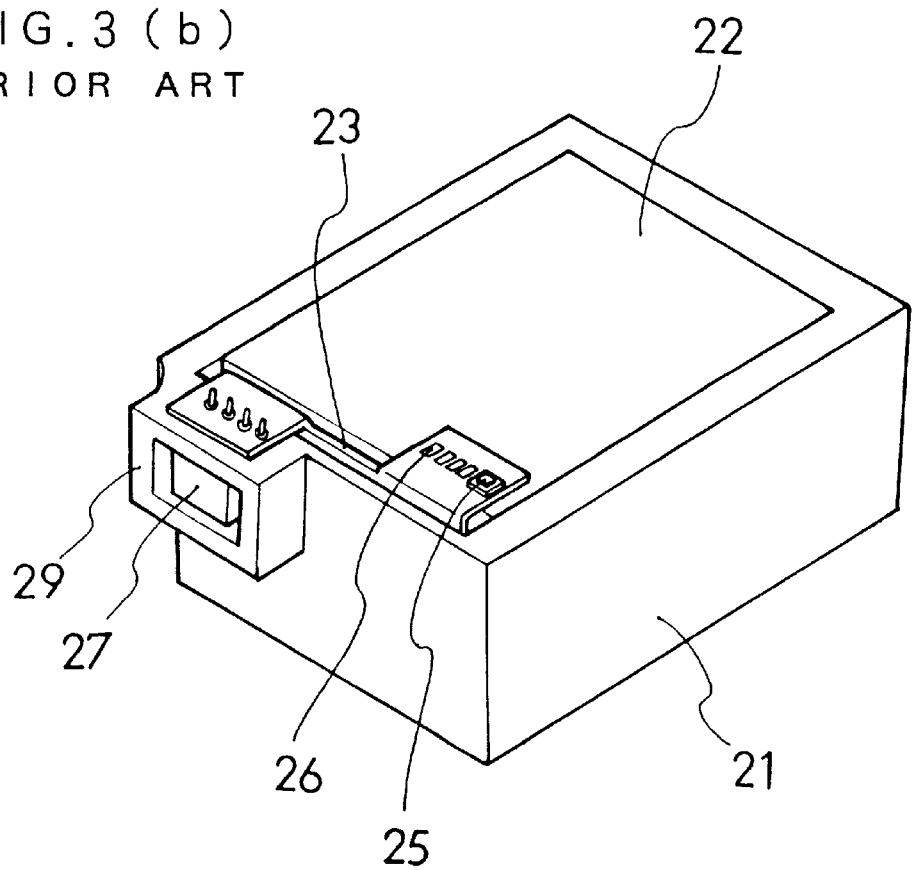
Figure 4:
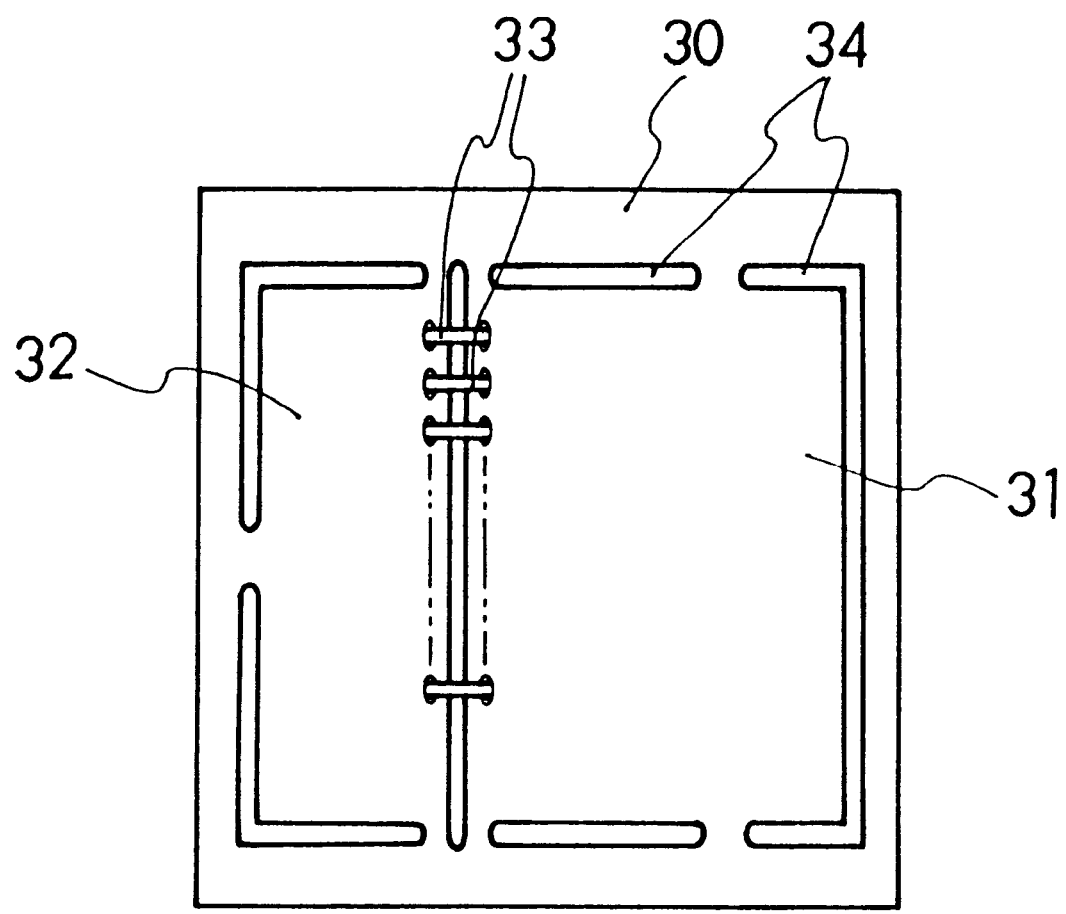
FIG. 4 is an illustrative view of other example of the conventional circuit substrate connection method.

In order to form a cell box for a notebook type personal computer, an electric circuit substrate as shown in FIG. 1(*a*) is accommodated so as to have the part of the main circuit substrate 1 inserted in the gap between the cell containing part 22 of the resin case 21 and an end part of the case 21, as shown in FIG. 2. To the connector containing part 29 of the case 21 there is previously fixed a connector 12, and the connector pin thereof is projected upward. In an example as shown in FIG. 2, the connector 12 is a female type connector which can receive insertion of the connecting pin from the lateral side.

When the main circuit substrate 1 is inserted in the predetermined gap of the case 21, the sub-circuit substrate 3 can be positioned on the predetermined connector containing part 29, so that by forming the terminal hole of the connector connecting part 7 in a slightly larger size, the terminal hole of the connector connecting part of the sub-circuit substrate 3 can be easily inserted into the projected connector pin. This is because the main circuit substrate 1 and the sub-circuit substrate 3 are connected by the metal piece 8 under the accurately position set condition, and the sub-circuit substrates 2, 3 of the electric circuit substrate are bent respectively in the direction of 90 degrees to the main circuit substrate 1, and the direction of bend is constant, and the partially bent electric circuit can be formed constant without causing change to mutual positional relations. Therefore, without resorting to the manual work, by continuously inserting the main circuit substrate 1 by an automatic machine, the connector connecting part 7 of the sub-circuit substrate 3 is automatically inserted in the connector pin. Thereafter, by soldering the connector pin and the connector connecting part 7 of the sub-circuit substrate 3, assembly can be simply realized. The switch 5 and the LED 6 also can be provided by exposure on one side of the cell box and fixed in a condition easily observable from outside, by simply inserting the main circuit substrate 1, because the sub-circuit substrate 2 is bent in a direction of 90 degrees to the main circuit substrate 1.

According to the present invention, to provide for the case of necessity to bend a part of the electric circuit substrate, the substrate is separated into the main circuit substrate and the sub-circuit substrate by a substrate having mechanical strength such as a print substrate, and the two members are electrically connected by a metal piece. And, by bending the metal piece, the sub-circuit substrate is bent to the main circuit substrate. Accordingly, the bent part is not thin in comparison with the wiring of the flexible substrate but is as thick as about four times to a degree of 100–150 $\mu$m, and as it has high mechanical strength and large electric current capacity. Moreover, due to the connection by a metal piece, there is no necessity to provide the substrate with a throughhole as in the plated wire but the electric parts can be set on the substrate in high density, and the substrate can be bent at an optional angle at an optional place with the mechanical strength sufficiently maintained. As a result, even when it is necessary to insert in a narrow gap as in the electric circuit substrate of a cell box for a notebook type personal computer, it becomes possible to form an electric circuit compactly by providing the electric parts in high density on a small main circuit substrate, and as there is no exertion of the stress to the soldered part or the electric part, reliability of the substrate is outstandingly improved.

Furthermore, in case of the provision of the parts such as a switch to which the external stress is applied, there is no backup required for reinforcement from the reverse side of the substrate. That is to say, in case of using a conventional flexible substrate, if the reliability of soldering part or electric parts and wiring and the like and stress is exerted from outside source such as a switch, reinforcement of the substrate from the reverse side has been necessitated, but in the invention method those problems are dissolved. Furthermore, as it is possible to make the metal piece thicker than the wiring comprising the copper foil of flexible substrate, large electric current can be led with small area. Also, in comparison with the plated wire, the invention substrate has a sectional area larger by more than 30%, it is easy to bend, and accurately bent even in case of the requirement for fine dimensional precision, thus providing improved positional accuracy of the parts. Furthermore, it is possible to make the width of the metal piece of the large electric current portion large according to the circuit to cope with the large electric current.

In the foregoing embodiment, there is used a substrate having mechanical strength such as a print substrate for both the main circuit substrate and the sub-circuit substrate. To use such substrate is preferable from the points of low price and large mechanical strength. However, in such case that the circuit substrate parts and the like have already been formed by the available flexible substrate or the like or designed, flexible substrate and the like may be used for the main circuit substrate and/or the sub-circuit substrate and the metal piece of the present invention may be used for the bending parts to make connection between the main circuit substrate and the sub-circuit substrate, thereby expecting to make improvement of reliability.

In the foregoing embodiment, there is adopted a structure that the connector can be connected from the lateral side of the case of the cell box. However, any other structure to take out from the lower side of the connector storing part or a male type connector may be used. Furthermore, though the display part such as LED and the connector connecting part are provided in the separate sub-circuit substrates, they may be provided on the same sub-circuit substrate. Still further, the sub-circuit substrate may be formed in a larger number of three. Further, the display part such as LED is preferably visible from outside under the condition of being assembled in a set of a notebook type personal computer or the like, but there is not necessarily the case where the assembly can be made in a position visible from the outside of the set. The display may be constituted not necessarily by LED but by a liquid crystal display device or a miniature lamp or the like. In addition, in the example described above, the main circuit substrate is inserted in the gap between the cell storing part and one end part of the case, but the gap into which the main circuit substrate is inserted is not limited to such an example.

According to the present invention, even in case of the necessity to insert in a narrow gap and to bend a part of the substrate, a low priced electric circuit substrate can be obtained in high precision. Moreover, the substrate is stout and does not necessitate any extra part such as reinforcing material, it is possible to make accurate position setting of the electric parts in which the position setting of the set like a display part with the case, and also to lead large electric current, thus assuring a large improvement in reliability.

Although preferred example have been described in some detail, it is to be understood that certain changes can be made by those skilled in the art without departing from the spirit and scope of the invention as defined by the appended claims.

What is claimed is:

1. A partly bent electric circuit substrate comprising:
   a main circuit substrate in which electric parts are carried to form an electric circuit;
   a sub-circuit substrate in which at least a connecting part with an external circuit or a switch or a display element can be provided; and
   a flat metal piece for electrically connecting said main circuit substrate with said sub-circuit substrate, said flat metal piece bent at an angle;
   wherein due to said flat metal piece being bent, said sub-circuit substrate is bent at an angle relative to said main circuit substrate.

2. A partly bent electric circuit substrate according to claim 1, wherein said main circuit substrate and said sub-circuit substrate comprise respectively a print-circuit board.

3. A partly bent electric circuit substrate according to claim 1, wherein said main circuit substrate and sub-circuit substrate are electrically connected by a soldering of said metal piece at both ends on pads for electrical connection on surfaces of said main circuit substrate and said sub-circuit substrate.

4. A partly bent electric circuit substrate according to claim 1, wherein said ribbon form metal piece has its thickness of 100 to 150 $\mu$m.

5. A partly bent electric circuit substrate according to claim 1, wherein there are provided one or more pieces of said sub-circuit substrate, and said sub-circuit substrate is provided with at least a display element and a connecting part with a connector.

6. A cell box comprising:
   a case;
   a cell containing part providing in said case; and
   an electric circuit substrate to be inserted in a gap in a vicinity of said cell containing part;
   wherein said electric circuit substrate comprises a main circuit substrate in which electric parts are carried to form an electric circuit, sub-circuit substrate in which there can be provided at least an element composed of a switch, a display element, and a connecting unit for a connector, and a flat metal piece for electrically connecting said main circuit substrate with said sub-circuit substrate, said flat metal piece bent at an angle, wherein due to said flat metal piece being bent, said sub-circuit substrate is bent at an angle relative to said main circuit substrate.

7. A cell box according to claim 6, wherein there are provided one or more pieces of said sub-circuit substrate, and said sub-circuit substrate is provided with at least a display device and a connecting part with the connector.

8. A cell box according to claim 6, wherein at least one piece of said sub-circuit substrate is bent at a right angle with said main circuit substrate so as to be exposed to one side of said case.

9. A cell box according to claim 8, wherein there are provided at least two pices of said sub-circuit substrate, which are bent to the opposite sides respectively at a center of said main circuit substrate.

* * * * *